(12) United States Patent
Pomata et al.

(10) Patent No.: US 6,586,994 B2
(45) Date of Patent: Jul. 1, 2003

(54) VARIABLE GAIN AND LOW NOISE AMPLIFIER FOR RECEIVED SIGNALS IN IMAGING APPARATA

(75) Inventors: Francesco Pomata, Genoa (IT); Antonio Questa, Novi Ligure (IT)

(73) Assignee: Esaote S.p.A. (IT)

( * ) Notice: Subject to any disclaimer, the term of this patent is extended or adjusted under 35 U.S.C. 154(b) by 0 days.

(21) Appl. No.: 10/147,225

(22) Filed: May 16, 2002

(65) Prior Publication Data

US 2002/0175752 A1 Nov. 28, 2002

(30) Foreign Application Priority Data

May 28, 2001 (IT) .................. SV2001A000016

(51) Int. Cl.⁷ .................................. H03G 3/20
(52) U.S. Cl. .................. 330/141; 330/281; 330/282
(58) Field of Search ............... 330/69, 86, 141, 330/281, 282, 254, 259

(56) References Cited

U.S. PATENT DOCUMENTS

| | | | | |
|---|---|---|---|---|
| 4,216,434 A | * | 8/1980 | Wermuth | 330/86 |
| 5,841,318 A | * | 11/1998 | Cram | 330/9 |
| 6,407,631 B2 | * | 6/2002 | Yamashita | 330/69 |

* cited by examiner

Primary Examiner—Henry Choe
(74) Attorney, Agent, or Firm—Woodard, Emhardt, Moriarty, McNett & Henry LLP

(57) ABSTRACT

The invention relates to a variable gain and low noise amplifier for received signals in ultrasound or nuclear magnetic resonance imaging apparata. This variable gain and low noise amplifier comprises at least one amplifier unit having at least one input and at least one output and at least one feedback circuit which connects one of the output signals with a feedback input. The variable gain and low noise amplifier is characterized in that at least one feedback circuit comprises at least one capacitive divider.

28 Claims, 2 Drawing Sheets

VARIABLE GAIN AND LOW NOISE AMPLIFIER FOR RECEIVED SIGNALS IN IMAGING APPARATA

REFERENCE TO RELATED APPLICATION

The present patent application claims foreign priority benefits under 35 U.S.C. §119 to Italian patent application No. SV2001A000016, filed May 28, 2001, now pending.

BACKGROUND OF THE INVENTION

The invention relates generally to a variable gain amplifier for received signals in ultrasound or nuclear magnetic resonance imaging apparata comprising at least one amplifier unit having at least one input and at least one output and at least one feedback circuit which connects one of the output signals with a feedback input.

Conventional variable gain amplifiers of this general type are known in the art, in which a feedback circuit, which connects an output with a feedback input, uses resistive elements to define the amplification factor.

FIG. 1 shows prior art, with the amplification factor being given by the ratio between the values of the two resistors R1/R2. In this case, high amplification factors are easily obtained, by properly selecting a high value for R1. Nevertheless, this generates a high thermal noise which is a troublesome drawback in the particular application of ultrasound or nuclear magnetic resonance signal amplification, due to the low power of the useful received signal.

On the other hand, this specific application wherefor the amplifier is designed, defines the ideal characteristics thereof. Hence, for ultrasound and nuclear magnetic resonance imaging applications, the amplifier must have a wide band and high amplification factors, while keeping noise levels to a minimum. It shall be noted that the received signals to be amplified have a strength of a few microvolt and frequencies of the order of radio-frequencies. These signals should be typically amplified by a few tenths of db. All the above listed specifications tend to be in contrast with each other, i.e. any intervention aimed at meeting one of the specifications of the amplifier impairs the other required conditions. Moreover, since these received signals have predetermined frequencies, the amplifier should be further allowed to operate in a linear manner over received signals having frequencies within a predetermined range.

An additional requirement of the specific field of application for the present invention consists in obtaining a variable gain for the amplifier. This allows to compensate for any natural attenuation of the train of signals received along a scan line of an ultrasound probe. The illuminating pulses transmitted by the probe are reflected at different depths of the body under examination, and the reflected signals are naturally attenuated to an extent related to the depth of the body under examination whereat they are generated as a reflection of the pulses emitted by the probe. Therefore, attenuation is a function of reflection depth and, as a result, a function of time. This attenuation, when not properly compensated for by a corresponding variation of the amplification ratio, would introduce errors in the evaluation of received signals.

Particularly, the feedback circuit of an amplifier causes a negative feedback or reverse feedback, wherein the output signal is drawn by a special feedback circuit and properly processed and is applied to the feedback input where said processed output signal is subtracted, via a suitable mixer circuit, from the input signal applied to the amplifier.

An advantage provided by the use of negative feedback in an amplifier is that the amplifier gain may be stabilized with respect to the variations of the characteristic parameters of active elements (transistors, FET, MOSFE, operational amplifiers, electronic tubes) used in the amplifier. Hence, if the amplifier gain without the negative feedback circuit is sufficiently high, the application of said circuit proves to cause the amplifier gain to only depend from the parameters of the negative feedback circuit. Another important advantage deriving from the use of negative feedback is the considerable increase of frequency response and linearity in the amplifier which uses negative feedback as compared with an amplifier having the same gain as that of the amplifier which uses negative feedback, but obtaining said gain without using a negative feedback circuit.

If the amplifier is intended to have a constant gain with respect to the width of the signal applied to the input, then the negative feedback circuit will be formed by linear elements, such as resistors, capacitors and inductors. If this is the case the amplifier gain will only depend on the values of these elements.

However, if the amplifier is intended to have a variable gain with respect to the width of the signal applied to the input, then the negative feedback circuit must have at least one non linear element.

The simplest method to apply a nonlinearity in the negative feedback circuit consists in using an element which has a variable resistance, the latter being a function of the voltage applied to this element and/or to the current which flows through it. For instance, by using a properly connected diode in the negative feedback circuit, a variable gain amplifier may be obtained.

The use of nonlinear elements, such as diodes, in the negative feedback circuit, introduces a resistive nonlinear relationship between the input signal and the output signal of the negative feedback circuit, thereby causing a strongly nonlinear operation of the whole amplifier. Moreover, the presence of diodes over the path of the negative feedback signal or over the path of the main signal causes an increase of the amplifier noise, and hence a decrease of the signal-to-noise ratio of the amplifier.

The present invention is based on the problem of providing a variable gain and low noise amplifier for received signals in ultrasound or nuclear magnetic resonance imaging apparata like the one described hereinbefore, in such a manner that, by simple, inexpensive and safely operating arrangements, the above drawbacks of well-known devices may be obviated, and the needs of the specific field of application may be satisfactorily accounted for, while suppressing or minimizing the drawbacks deriving from the fulfillment of contrasting requirements or specifications.

The present invention solves the above problems by providing a variable gain and low noise amplifier for received signals in ultrasound or nuclear magnetic resonance imaging apparata like the one described herein, in which at least one feedback circuit comprises at least one capacitive divider.

The capacitive divider is made in such a manner that the selected capacitance values provide constant reactance values at the operating frequencies. This provides low resistive values and high amplification factors. Therefore, the drawback caused by the high thermal noise generated by purely resistive negative feedback circuits is obviated, while reaching the required high amplification factors. Further, the particular selection of capacitance values ensures that the amplifier response is linear and within the band of frequencies designed for the received signals to be amplified.

By using a capacitive divider, the physiological time-related attenuation of the received signals, to be amplified may be also automatically accounted for. The invention achieves this result by changing the amplification ratio in a manner that is related and opposite to attenuation, in order to compensate for it. A particular embodiment of the amplifier allows to perform this automatic compensation of the amplification factor without affecting the signal-to-noise ratio. This is possible thanks to the fact that the resistive behavior is constant and unaffected by the amplification factor, and with the operating point of the amplifier always being in the linear range.

With reference to a negative feedback circuit having a capacitive divider, the amplification factor A is given by $$|A|=|Z1(f)|/|Z2(f)|$$

where $$|Z1,2(f)|=|R1,2+1/xc1,2(f)|$$

in which xc1,2 (f) are the reactance values depending on the frequency (f) of the received signals to be amplified.

SUMMARY OF THE INVENTION

A variable gain amplifier for received signals in imaging apparata according to one embodiment of the present invention comprises at least one amplifier unit having at least one input and at least one output and at least one feedback circuit which connects one of the output signals with a feedback input, characterized in that at least one feedback circuit comprises at least one capacitive divider.

One object of the present invention is to provide an improved variable gain amplifier.

Related objects and advantages of the present invention will be apparent from the following description.

DESCRIPTION OF THE PREFERRED EMBODIMENT

Figure 1:
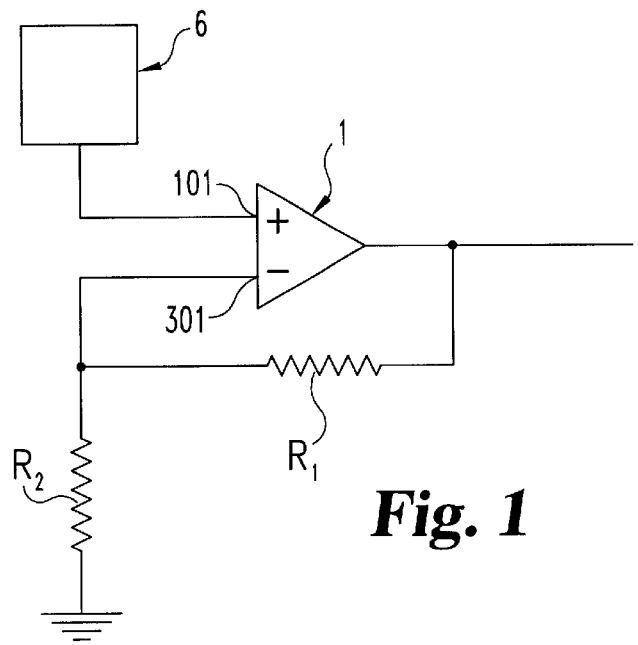
FIG. 1 is a schematic view of a resistive negative feedback amplifier according to the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to a specific embodiment of the present invention and reviewing the configuration of the present invention in general terms, the following disclosure is provided. Without limitation to the fact that, depending on the various needs, the feedback circuit may be composed of appropriately connected and combined resistors, capacitors, inductors, the feedback circuit has two branches. The first branch of said circuit is connected between the output terminal of the amplifier unit and the feedback input terminal of the amplifier unit and to the first end of a second branch of the feedback circuit.

The second branch of the feedback circuit is formed by the parallel paths of a variable capacitive element and a resistor. The second branch of the feedback circuit is connected between the feedback input of the amplifier unit (whereby it is also connected to the second end of the first branch of the feedback circuit) and the ground or common terminal of the circuit.

Therefore, the arrangement of the first and second branches of the feedback circuit generates a divider, mainly of the capacitive type at the frequencies of the signals whereat the low noise amplifier operates.

The variable capacitive element consists of a resistor and a capacitor in series, the latter being allowed to change its capacitance within a predetermined range.

The opportunity of having an element which can change its characteristic parameter allows to vary the parameters of the amplifier, such as gain, cutoff frequency within a wide range to obtain the best performance in relation to the intended use.

Particularly, the variable capacitor positioned on the second branch of the feedback circuit is a capacitor whose capacitance varies as a function of the applied voltage. This may be obtained, for instance, by a varicap diode.

The varicap or varactor diode is a particular type of diode which provides a considerable variation of the junction capacitance as a function of the voltage applied to its terminals. The capacitance of a semiconductor reverse-biased p-n junction varies with voltage and this variation may be advantageously used in a number of electronic circuits. Amongst the various applications, the diode may be used to tune resonant circuits or as a variable capacitive element in a filter.

Other methods are known to obtain capacitive elements whose capacitance varies with the voltage applied to the terminals of the capacitive element. For example, capacitors may be used which have the dielectric constant of the dielectric material in use as a function of the electric field, hence of the voltage applied to the plates of the capacitor.

The variable capacitive element is particularly obtained from at least one pair of series-connected varicap diodes. The cathode of a first varicap diode is connected to a positive supply source, the anode of said first varicap diode is connected to the cathode of the second varicap diode, whereas the anode of the second varicap diode is connected to a negative supply source. The signs of both supply sources are referred to the circuit ground.

Hence, the two varicap diodes are reverse biased, which is the condition of operation of this type of electronic element.

It shall be noted that a variable capacitive element might be also obtained from a single reverse biased varicap diode, but this particular diode configuration has bee selected because it ensures that the operating point of the variable capacitive element is maintained in the proper, particularly reverse-biased condition, which is of substantial importance due to the particular field of use of this low noise amplifier circuit.

Hence, by connecting the diodes in series, as described above, the capacitive element may be caused to have substantially the same behavior with respect to positive half-waves and negative half-waves of the signal voltage applied to the element. Obviously, in order that this may be accurately verified, the two diodes must have identical characteristic curves, whereby these elements shall be selected in such a manner that the characteristic parameters are within a predetermined allowed uncertainty range.

Both positive and negative varicap diode supply sources consist of two direct voltage generators whose negative and positive poles, of the positive and negative supply source respectively are directly connected to the ground or to the common terminal of the circuit. The remaining positive and negative poles of the two generators are connected to the first of two terminals of two resistors. Then, the second terminals of said resistors are connected with the unshared cathode and anode respectively of the pair of varicap diodes which form the variable capacitive element.

In order to attenuate any possible components of the high frequency signal which might cause operational drawbacks at the supply sources of the pair of varicap diodes, between the circuit ground, the unshared cathode and anode of the pair of varicap diodes, two capacitors having a suitable capacitance are connected.

The function of the direct-current power supply sources of the varicap diodes is to supply the reverse bias voltage to obtain the capacitance value required for the operation of the feedback circuit of the variable gain amplifier.

The shared anode and cathode of the pair of varicap diodes are connected to a decoupling capacitor, which is series-connected to a resistor, which is in turn connected to the feedback terminal of the input unit of the low-noise amplifier.

The function of the decoupling capacitor is to only allow the passage of the alternating component of the amplified signal and to block any direct component of the voltage which might generate undesired circulating currents between the variable capacitive element and the output and feedback circuits, since the bias voltages of said sections of the amplifier circuit might generally be different.

In order to obtain a greater capacitance, the variable capacitive element is obtained from two pairs of varicap diodes which are connected first in parallel, and then in series.

The input terminal of the amplifier unit is connected to an input unit which filters out any undesired component of the input signal of the variable gain amplifier. The input signal of the variable gain amplifier is schematically indicated by an alternating voltage generator.

A decoupling capacitor is also provided on the input unit circuit, and is series-connected to the generator which provides the input signal to prevent any circulating current with any other circuit upstream from the low-noise amplifier.

The input signal which is withdrawn from the decoupling condenser is applied between the cathode and the anode of two different series-connected diodes which are part of a first branch of a diode bridge consisting of two diode pairs connected first in series and then in parallel. The shared anode and the cathode of the second branch of the diode bridge also forms the output of the input signal to the diode bridge.

The shared anodes and cathodes of the two branches of the diode bridge disposed in parallel are then connected via two resistors having identical values to the positive and negative poles, for anodes and cathodes respectively, of two direct voltage generators which have equal voltage values. The other two negative and positive poles of said direct voltage generators are connected to the ground of the amplifying circuit.

These diode bridge supplying direct voltage generators also act as supply sources for the amplifier unit.

The output signal from the diode bridge is applied via a decoupling capacitor to an impedance matching device, which transfers the output signal from the diode bridge to the input of the amplifier unit.

The impedance matching device is a high frequency transformer, having a primary and a secondary windings. Particularly these primary and secondary windings have two connection terminals each. All transformers with windings having one or more intermediate taps shall be excluded.

The first terminal of the primary winding of the transformer is connected to the decoupling condenser at the output of the diode bridge, whereas the second terminal of the primary winding is connected to the amplifier circuit ground.

Two diodes are further connected to the terminals of the primary winding in parallel, which diodes are also connected with each other in an antiparallel fashion.

The first terminal of the secondary winding of the transformer is connected to the input of the amplifier unit, whereas the second terminal of said secondary winding is connected to the circuit ground.

Since the low-noise amplifier operates with high frequency signals, the two pairs of diodes which form the bridge and the two diodes aligned in an antiparallel fashion, are high-speed switching diodes.

The amplifier unit is an operational amplifier. Particularly, the amplifier unit is a low-noise operational amplifier.

In order to minimize the size of the low-noise amplifier and to obtain it in a simple and inexpensive manner, the amplifier unit is an integrated operational amplifier.

Figure 2:
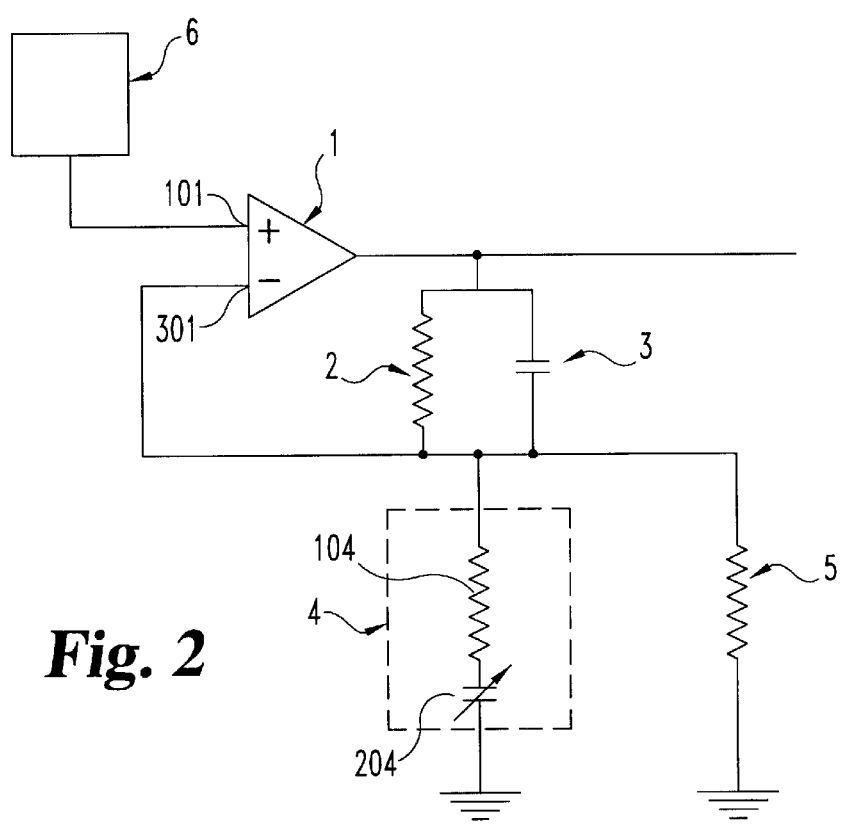
FIG. 2 shows the skeleton diagram of the FIG. 1 variable gain and low-noise amplifier.
Figure 3:
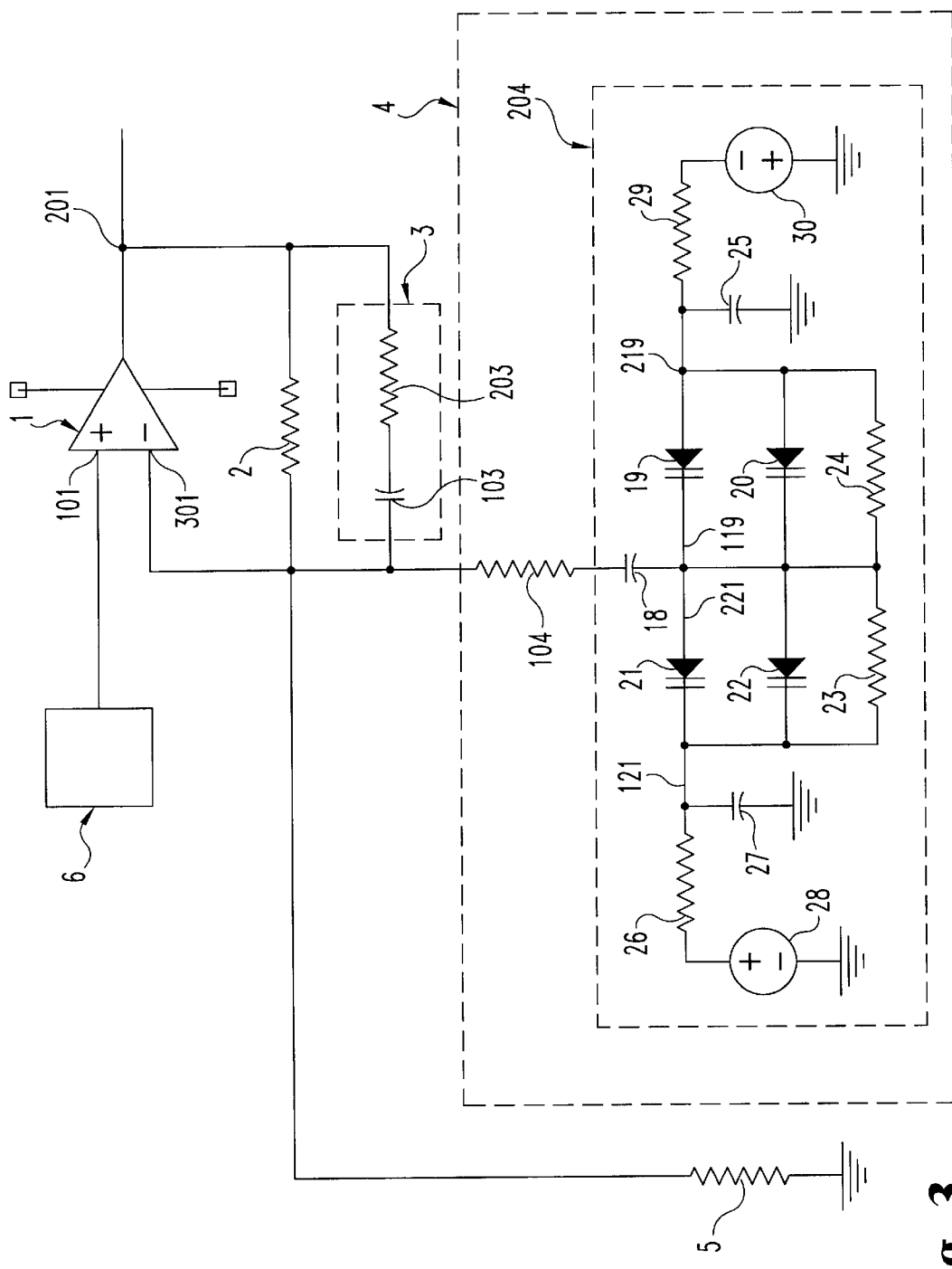
FIG. 3 shows the detailed wiring diagram of a preferred embodiment of a variable gain and low-noise amplifier according to the present invention.

Referring more specifically to FIGS. 1, 2, and 3, the variable gain and low-noise amplifier for received signals in ultrasound or nuclear magnetic resonance imaging apparata according to the present invention comprises at least one amplifier unit 1 having at least one input 101 and at least one output 201 and at least one feedback circuit which connects one of the output signals with a feedback input 301.

A unique characteristic of the invention is that at least one feedback circuit comprises at least one capacitive divider.

A first branch of the feedback circuit, as shown in the diagram of FIG. 1 consists of a resistor 2 which is connected in parallel with a capacitive element 3. The first end of the first branch, which is formed by the parallel paths of the two elements 2, 3 is connected to the output 201 of the amplifier unit 1, whereas the second end of the first branch, which is formed by the parallel paths of the two elements 2, 3 is connected both to the feedback input 301 of the amplifier unit 1 and to the first end of a second branch of the feedback circuit.

The second branch of the feedback circuit, as shown in the diagram of FIG. 1 consists of the parallel paths of a variable capacitive element 4 and a resistor 5. The first end of the second branch, formed by the parallel paths of the two elements 4, 5 is connected both to the feedback input 301 of the amplifier unit 1 and to the second end of the first branch of the feedback circuit, whereas the second end of the second branch, formed by the parallel paths of the two elements 4, 5 is connected to the ground or to the common terminal of the circuit.

The variable capacitive element 4 is in turn formed by the series-connection of a resistor 104 and a capacitor 204, the latter being allowed to change its capacitance within a predetermined range.

This allows to change the parameters of the amplifier, such as gain, cutoff frequency within a wide range to obtain the best performance as a function of the intended use in relation to the intended use.

Particularly, said variable capacitor 204 is a capacitor whose capacitance varies as a function of the voltage applied to its terminals. This may be obtained by using a varicap diode, which provides a considerable variation of its junction capacitance as a function of the voltage applied to its terminals.

Another method to obtain a capacitance variation related to the voltage applied to the terminals of the capacitor consists in using capacitors which have the dielectric constant of the dielectric material in use as a function of the electric field, hence of the voltage applied to the terminals of the condenser.

As shown in the detailed diagram of FIG. 2, the capacitive element 3 is shown in such a manner as to illustrate the actual behavior with a capacitor 103 connected in series with a resistor 203.

As shown in the detailed diagram of FIG. 2, the variable capacitor 204 of the variable capacitive element 4 as shown in the skeleton diagram of FIG. 1 is obtained from at least one pair of varicap diodes 19, 21 connected in series with each other. Two resistors 23, 24 are further connected in parallel to the varicap diodes 19, 21.

The cathode 121 of the varicap diode 21 is connected to a positive supply source.

Said positive supply source is a direct voltage generator 28 whose negative pole is directly connected to the circuit ground, whereas the positive pole is connected to the first of two terminals of a resistor 26. Then, the second terminal of the resistor 26 is connected to the cathode 121 of the varicap diode 21. A capacitor 27 is connected between the cathode 121 of the varicap diode 21 and the circuit ground.

Conversely, the anode 219 of the varicap diode 19 is connected to a negative supply source.

The negative supply source is obtained from a direct voltage generator 30 whose positive pole is directly connected to the circuit ground, whereas the negative pole is connected to the first of two terminals of a resistor 29. Then, the second terminal of the resistor 29 is connected to the anode 219 of the varicap diode 19. A capacitor 25 is connected between the anode 219 of the varicap diode 19 and the circuit ground.

The function of the direct voltage generators 28, 30 is to supply the bias voltage for the varicap diodes 19, 21 to obtain the capacitance value required for the operation of the feedback circuit of the variable gain amplifier.

Then, the anode 221 of the varicap diode 21 and the cathode 119 of the varicap diode 19 are connected to a decoupling condenser 18 which is in turn connected in series with the resistor 104.

In order to obtain a greater capacitance, as shown in the detailed diagram of the amplifier of FIG. 2, the variable condenser 204, as shown in the skeleton diagram of FIG. 1 is particularly obtained from two pairs of varicap diodes 19–20, 21–22 connected in parallel and then in series.

The received signals are sent to the input 101 of the amplifier unit 1 via a switching, so-called diplexing, and impedance matching circuit, which is generally known and widely used particularly in ultrasound imaging apparatuses. The impedance matching function is obtained by any well-known technique, suitable for the specific application. The diplexer functions are necessary in the field of ultrasounds, as the transducers for transmitting the illuminating pulses transmitted in the body under examination are also receiving transducers and are alternatively driven to transmit and receive in accordance with predetermined protocols.

The unit that is generally denoted with numeral 6 in the Figures may also be of another type and comprise, amongst other things, means for filtering the received signals.

The amplifier unit 1 is an operational amplifier. Particularly, the amplifier unit 1 is a low-noise operational amplifier.

In order to minimize the size of the low-noise amplifier and to obtain it in a simple and inexpensive manner, the amplifier unit 1 is an integrated operational amplifier.

Obviously, if required by particular needs, two or more low-noise amplification circuits might be connected in cascade.

Another configuration of the low-noise amplifier obtained through operational amplifiers is the one in which the operational amplifier is a summing amplifier. In this case, the signal output from the amplifier unit 1 is the sum of two or more signals coming from two or more input units 6.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A variable gain amplifier for received signals in imaging apparata comprising at least one amplifier unit having at least one input and at least one output and at least one feedback circuit which connects one of the output signals with a feedback input, characterized in that at least one feedback circuit comprises at least one capacitive divider, said feedback circuit providing a gain that is independent of the frequency of the signal from said output.

2. A variable gain amplifier as claimed in claim 1, characterized in that the capacitance values of said capacitive divider are defined in such a manner as to obtain a constant reactance for the range of possible frequencies of the received signals.

3. A variable gain amplifier as claimed in claims 1 or 2, characterized in that the capacitance values of said capacitive divider are selected in such a manner as to generate a high amplification factor and a low resistive value in the negative feedback circuit.

4. A variable gain amplifier as claimed in claim 1, characterized in that the capacitive divider is controlled from the outside by a function of variation of the amplification factor with time, which is related to a function of attenuation with time of a succession of received signals deriving from or caused or generated by the same excitation pulse, for instance an ultrasonic illumination pulse or a nuclear spin excitation gradient.

5. A variable gain amplifier as claimed in claim 1, characterized in that it has two branches, a resistor being provided in a first branch of the feedback circuit, and connected in parallel to a capacitive element.

6. A variable gain amplifier as claimed in claim 5, characterized in that the first end of the first branch, which is formed by the parallel paths of the two elements is connected to the output of the amplifier unit, whereas the second end of said first branch is connected both to the feedback input of the amplifier unit.

7. A variable gain amplifier as claimed in claim 5, characterized in that the second end of the first branch, which is formed by the parallel paths of the two elements is connected to the first end of a second branch of the feedback circuit.

8. A variable gain amplifier as claimed in claim 5, characterized in that the second branch of the feedback circuit is formed by the parallel paths of a capacitive element and a resistor.

9. A variable gain amplifier as claimed in claim 5, characterized in that the first end of the second branch, which is formed by the parallel paths of the two elements is connected both to the feedback input of the amplifier unit and to the second end of the first branch of the feedback circuit, whereas the second end of said second branch is connected to the ground or to the common terminal of the circuit.

10. A variable gain amplifier as claimed in claim 1, comprising a variable capacitor which is allowed to change its capacitance within a predetermined range.

11. A variable gain amplifier as claimed in claim 10, characterized in that said variable capacitor is a capacitor whose capacitance varies as a function of the voltage applied to its terminals.

12. A variable gain amplifier as claimed in claim 10, characterized in that said capacitor is a varicap diode.

13. A variable gain amplifier as claimed in claim 10, characterized in that the variable capacitance of said capacitor is obtained by using capacitors which have the dielectric constant of the dielectric material in use as a function of the electric field, hence of the voltage applied to the terminals of the capacitor.

14. A variable gain amplifier as claimed in claim 10, characterized in that the variable capacitor of the capacitive element is obtained from at least one pair of varicap diodes connected in series with each other.

15. A variable gain amplifier as claimed in claim 14, characterized in that two resistors are further connected in parallel to said varicap diodes.

16. A variable gain amplifier as claimed in claim 14, characterized in that the cathode of one of said varicap diodes is connected to a positive supply source.

17. A variable gain amplifier as claimed in claim 16, characterized in that the positive supply source is a direct voltage generator, whose negative pole is directly connected to the circuit ground, whereas the positive pole is connected to the first of two terminals of a resistor, whereas the second terminal of the resistor is connected to the cathode of the varicap diode.

18. A variable gain amplifier as claimed in claim 16, characterized in that a capacitor is connected between the cathode of one of said varicap diodes and the circuit ground.

19. A variable gain amplifier as claimed in claim 14, characterized in that the anode of the varicap diode is connected to a negative supply source.

20. A variable gain amplifier as claimed in claim 19, characterized in that the negative supply source is obtained from a direct voltage generator, whose positive pole is directly connected to the circuit ground, whereas the negative pole is connected to the first of two terminals of a resistor, whereas the second terminal of the resistor is connected to the anode of the varicap diode.

21. A variable gain amplifier as claimed in claim 19, characterized in that a capacitor is connected between the anode of the varicap diode and the circuit ground.

22. A variable gain amplifier as claimed in claim 14, characterized in that the anode of one of said varicap diodes and the cathode of said other varicap diode are connected to a decoupling capacitor.

23. A variable gain amplifier as claimed in claim 22, characterized in that said decoupling capacitor is in turn connected in series to the resistor.

24. A variable gain amplifier as claimed in claim 10, characterized in that, in order to obtain a greater capacitance, the variable condenser is particularly obtained from two pairs of varicap diodes connected in parallel and then in series.

25. A variable gain amplifier as claimed in claim 1, characterized in that the amplifier unit has said input connected to an input unit having various functions for pre-processing the received signal to be amplified.

26. A variable gain amplifier as claimed in claim 1, characterized in that the amplifier unit is an operational amplifier.

27. A variable gain amplifier as claimed in claim 1, characterized in that the amplifier unit is a low noise operational amplifier.

28. A variable gain amplifier as claimed in claim 1, characterized in that the amplifier unit is an integrated operational amplifier.

* * * * *